(12) United States Patent
Tao (10) Patent No.: US 6,756,685 B2
(45) Date of Patent: Jun. 29, 2004

(54) SEMICONDUCTOR DEVICE

(75) Inventor: Tetsuya Tao, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/210,157

(22) Filed: Aug. 1, 2002

(65) Prior Publication Data

US 2003/0030134 A1 Feb. 13, 2003

(30) Foreign Application Priority Data

Aug. 8, 2001 (JP) ....................................... 2001-240019

(51) Int. Cl.⁷ .............................................. H01L 23/48
(52) U.S. Cl. .................... 257/778; 257/789; 257/793; 257/795; 438/108
(58) Field of Search ............................ 438/106, 108, 438/118; 257/778, 789, 793, 795, 737, 738, 780, 790

(56) References Cited

U.S. PATENT DOCUMENTS 5,629,566 A * 5/1997 Doi et al. .................... 257/789
5,930,598 A * 7/1999 Wille et al. ................. 438/108

FOREIGN PATENT DOCUMENTS

| JP | 11-145336 | | 5/1999 |
| JP | 11-260960 | * | 9/1999 |
| JP | 2000-40776 | | 2/2000 |
| JP | 2000-260900 | * | 9/2000 |
| JP | 2001-127095 | | 5/2001 |

* cited by examiner

*Primary Examiner*—Jack Chen
(74) *Attorney, Agent, or Firm*—Choate, Hall & Stewart (57) ABSTRACT

In a semiconductor device which is formed by connecting electrodes of a package substrate composed of a resin and electrodes of a semiconductor chip formed of a silicon semiconductor, an underfill resin having the Young's modulus of less than 100 kgf/mm² is filled in the gap of the junction between the semiconductor chip and the package substrate.

10 Claims, 11 Drawing Sheets

SEMICONDUCTOR DEVICE

BACKGROUND OF THE INVENTION

1. Field of the Invention

The present invention relates to a semiconductor device, and more particularly to a semiconductor device in which a package is configured by loading a semiconductor chip on a package substrate.

2. Description of the Prior Art

As a kind of a package for a semiconductor device, there has been known one with a structure in which a semiconductor chip and the package substrate are united mechanically as well as electrically by loading a semiconductor chip having solder bumps with its face down on the package substrate. Moreover, in the semiconductor device of this kind, a constitution of a semiconductor device, the so-called flip-chip ball grid array (FCBGA) package, in which balls of a BGA are disposed in advance on the back face of the package substrate and a semiconductor package is mounted on a mother board with respect to the BGA balls.

Figure 10:
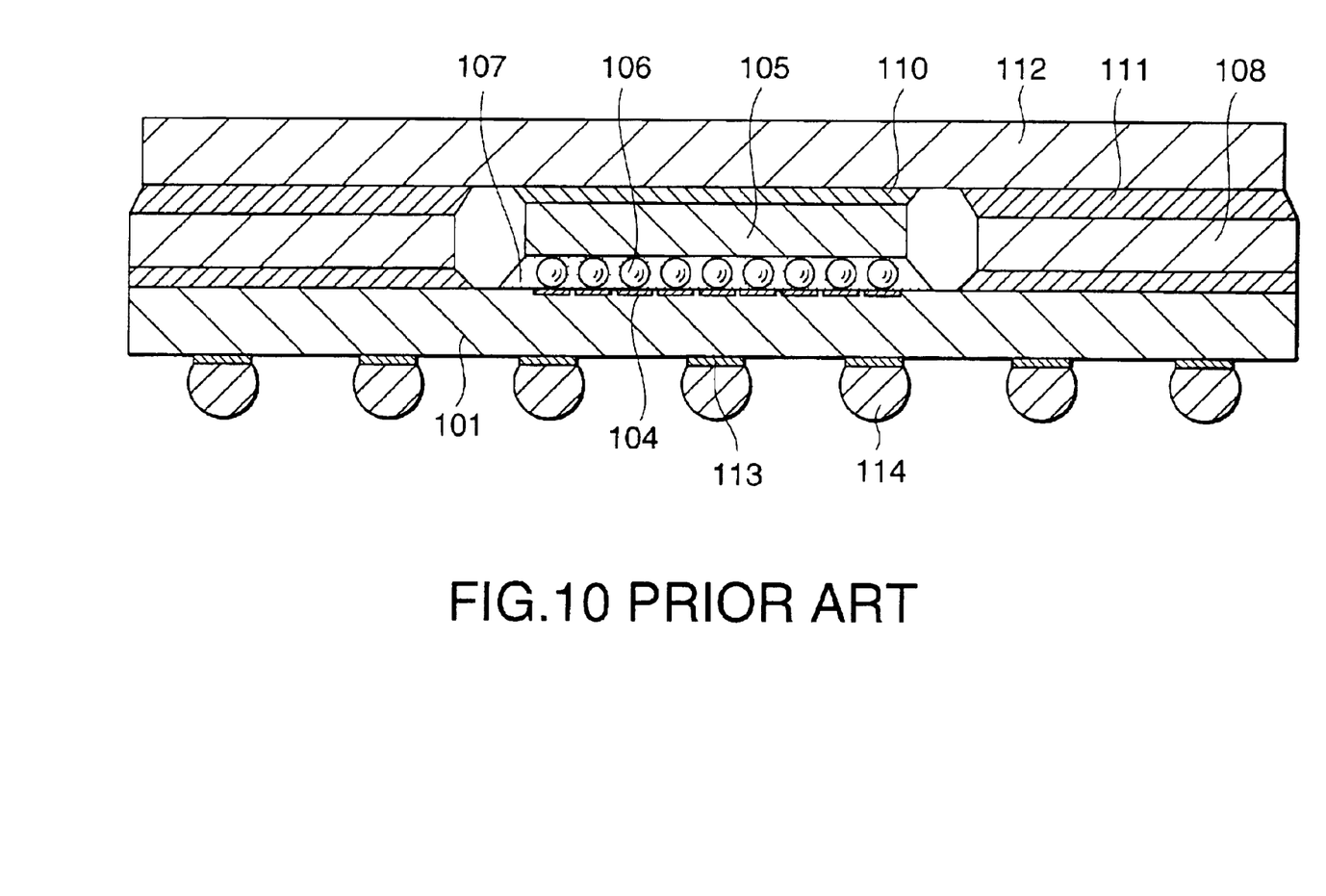
FIG. 10 is a sectional view showing the configuration of an example of the FCBGA package.

FIG. 10 shows an example of the FCBGA package, in which a package substrate 101 is obtained by forming a multilayer conductive layer, not shown, on an insulating substrate, rectangular frame-like Cu reinforcing plates 108 are bonded to the periphery of the top face of the packaging substrate 101 by means of an adhesive resin 109, a semiconductor chip 105 having solder bumps 106 is loaded with its face down on the surface of the package substrate 101 within the region surrounded by the reinforcing plates 108, and the solder bumps 106 are soldered to loading pads 104 of the package substrate 101. Underfill resin 107 is filled in the gap between the semiconductor chip 105 and the package substrate 101 covering the solder bumps to reinforce the bonding strength of the junction. An epoxy resin with Young's modulus 900 kgf/mm$^2$ and coefficient of thermal expansion 30 ppm/° C. is used as the underfill resin 107, and the underfill 107 is cured by heating it at 150° C. for about 1 hour. Silver paste 110 is applied to the top face of the semiconductor chip 105, an adhesive resin 111 is applied to the top face of the reinforcing plates 108, a Cu lid 112 is arranged covering the paste and the resin, and the lid 112 is settled there by curing the adhesive resin 111. Then, an FCBGA package is formed by arranging the BGA balls 114 to respective ball pads 113 disposed on the bottom face of the package substrate 101.

Figure 11:
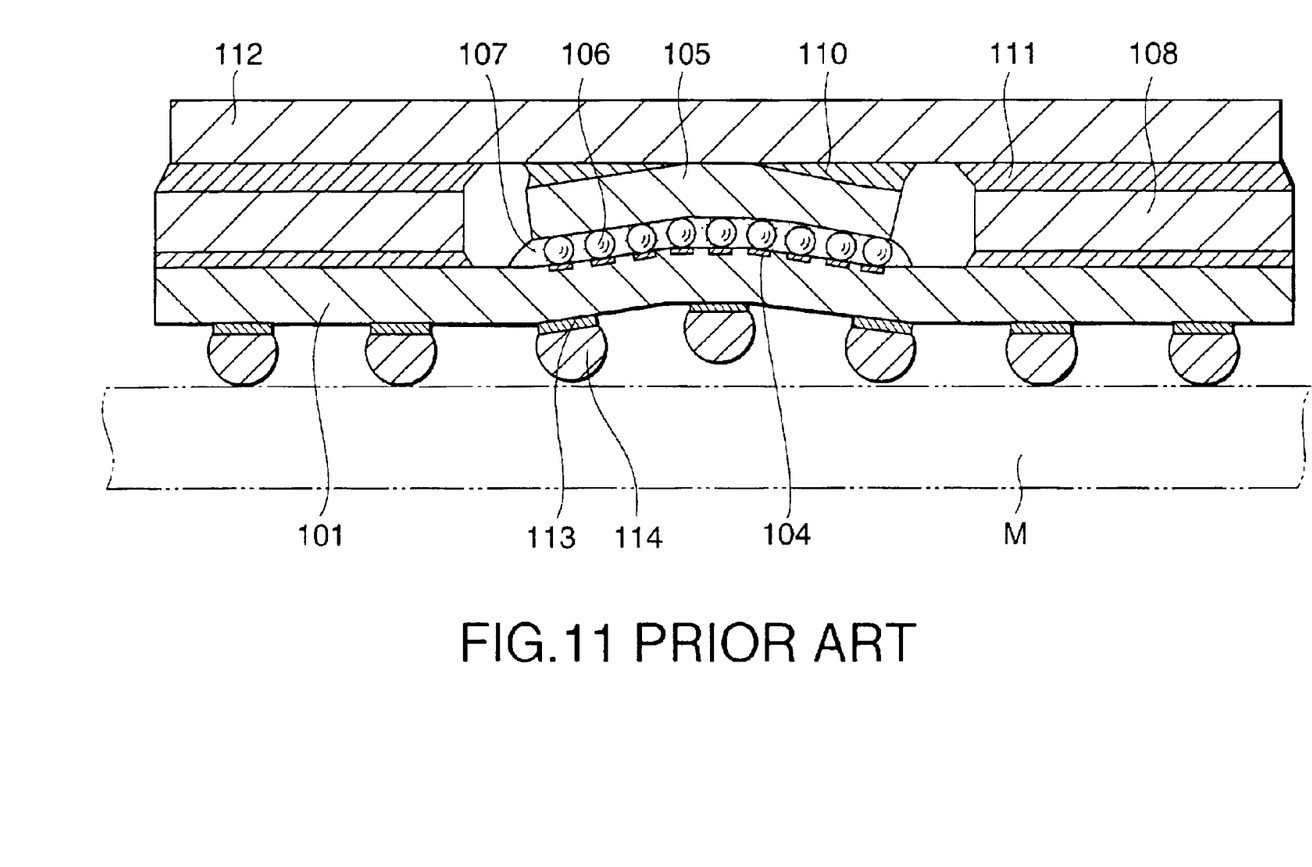
FIG. 11 is a sectional view for describing problems in the conventional FCBGA package.

In the semiconductor device of this kind, the semiconductor chip 105 and the package substrate 101 are often formed using silicon and resin, respectively. Because of this, when the semiconductor device is subjected to a thermal history, thermal stresses are generated between the semiconductor device 105 and the package substrate 101 due to the difference in the coefficient of thermal expansion between silicon and the resin of the package substrate (the coefficient of thermal expansion of silicon being 3 ppm/° C., and the coefficient of thermal expansion of the package substrate being 16 to 18 ppm/° C.), there is a possibility of generating a fracture in the junction of the semiconductor device 105 and the package substrate 101, namely, in the bonded parts of the solder bumps 106. Even though the possibility does not advance so far as to a fracture, there may occur a case in which a bending force is applied to the semiconductor device 105 and the package substrate 101 which may cause a warp in the semiconductor device 105, and further in the package substrate 101, as shown in FIG. 11. In particular, in the semiconductor device of the kind in recent years, the package substrate 101 is formed so thin that warping tends to be generated in the package substrate at directly below the semiconductor device 105. When such a warp is generated, the coplanarity of the BGA balls 114 in this region is degraded, which results in a state in which a part of the BGA balls 114 fails to make contact with the circuit pattern on the surface of the mother board M indicated by an imaginary line in the figure, resulting in a problem of deterioration in the reliability of the mounting. Moreover, if mounting is forced in such a condition, an excessive force is applied to the package board 101 and the semiconductor chip 105, leading to such problems as the generation of cracks or breakage in the semiconductor chip 105, and further, breaking of the solder bum junction parts during a heat cycle test.

As a first prior art technology for solving problems caused by the difference in the coefficient of thermal expansion between the semiconductor chip and the package substrate connected in the so-called flip-chip form, there has been proposed a technology as disclosed in Japanese Patent Applications Laid Open, No. Hei 11-145336. This is a technology in which the coefficient of thermal expansion of the underfill resin is chosen to be larger than the coefficient of thermal expansion of the semiconductor chip and smaller than that of the package substrate, that is, to have an intermediate value between the coefficients of thermal expansion of the semiconductor chip and the package substrate. With this arrangement, it is possible to relax thermal stresses, in particular the shearing force generated by a heat cycle in the junction between the semiconductor chip and the package substrate, by means of the underfill resin, and is possible to prevent fracture at the junction of the semiconductor chip. In the first prior art technology, since an epoxy resin is used as the underfill resin, the semiconductor chip and the package substrate are held in a united state when the underfill resin is cured, it is possible to relax the shearing force in the junction. However, it is difficult to prevent bending deformation, namely, warp of the semiconductor chip and the package substrate that is caused by the difference in the coefficient of thermal expansion between the semiconductor chip and the package substrate. Furthermore, the first prior art technology is for an example of the package substrate made of a ceramic, and it is not clear whether or not it is also applicable to a package substrate made of a resin.

In a second prior art technology disclosed in Japanese Patent Applications Laid Open, No. 2000-40776, there is proposed a technology in which the solder bumps of the semiconductor chip are covered with a high elasticity resin, and a low elasticity resin is filled in between the semiconductor chip and the package substrate so as to cover the solder bumps and the high elasticity resin. According to this technology it is possible for the high elasticity resin to prevent the fracture of the solder bumps by relaxing the stress (shearing force) exerted on the solder bumps by reducing the relative displacement between the semiconductor chip and the package substrate accompanying the difference in the coefficient of thermal expansion. At the same time, the low elasticity resin can prevent the peeling of the low elasticity resin by absorbing and dispersing the stress generated between the semiconductor chip and the package substrate.

However, it became clear as a result of experiment by the present inventor, as will be described later, that the effect of preventing warping that is generated in the semiconductor chip and the package substrate by relaxing the stresses generated between the semiconductor chip and the package substrate cannot be expected by the use of a silicone resin with Young's modulus of less than 200 kgf/mm$^2$ as is employed as the low elasticity resin in the second prior art technology. In other words, although a certain degree of warp prevention effect can be obtained by the use of a low elasticity resin having the Young's modulus in the neighborhood of the value mentioned above, for semiconductor devices with a chip size of a square with a side of 5 to 10 mm (called a 5 to 10 mm square), in the recent semiconductor devices which adopt a large chip size of 15 mm square or so, it is difficult, since the warpage increases following the chip size, to prevent the warpage in large-sized semiconductor chips. Here, it is conceivable to further lower the Young's modulus of the low elasticity resin, but it is difficult to reduce the Young's modulus of the silicone resin described in the report to below 100 kgf/mm$^2$, and eventually it is difficult to prevent the warp in the semiconductor chip or in the package substrate of semiconductor devices of large chip size and the fracture of solder bumps due to heat cycle test.

Furthermore, there is a third prior art technology disclosed in Japanese Patent Applications Laid Open, No. 2001-127095. This is a semiconductor device in which a layer insulating film and a resin sealing layer are formed on an electrode pad formation face of the semiconductor chip, and bump electrodes are formed as external connection terminals which penetrate the layer insulating film and the resin sealing layer to be exposed to the outside. The technology described in the report is such that in order to prevent generation of cracks in the bump electrodes accompanying thermal stress caused due to the difference in the coefficient of thermal expansion between the package substrate that loads the semiconductor chip and the bump electrodes, a part of the layer insulating film is formed of a resin with a specified low coefficient of thermal expansion and a specified low elastic modulus. According to this technology, it is possible to prevent cracks in the bump electrodes by relaxing thermal stress in the layer insulating film, and to enhance the connection reliability after packaging.

However, in the third prior art technology, it is necessary to form a semiconductor chip through flip-chip connection by forming the bump electrodes after providing the layer insulating film and the resin sealing layer, so that the number of manufacturing steps is increased which becomes an obstacle to the reduction in the cost. Moreover, since this prior art technology is not for semiconductor devices in which an underfill resin is filled in the gap between the semiconductor chip and the package substrate, it is difficult to apply it to such a semiconductor device in which an underfill resin is filled in the space between the semiconductor chip and the package substrate and tries to eliminate the problems described in the above through improvent of the underfill resin, as in the present invention.

BRIEF SUMMARY OF THE INVENTION

Object of the Invention

It is the object of the present invention to provide a semiconductor device which can prevent the warp in the semiconductor chip and the fracture of solder bumps in heat cycle test in a semiconductor device with large chip size and realize simplification of the structure and reduction in the cost as well. It is to be noted that "prevention of warp" mentioned in the foregoing and in the following includes suppression of the warpage within an allowable warpage range.

SUMMARY OF THE INVENTION

According to this invention, in a semiconductor device formed by connecting electrodes of a package substrate composed of a resin to electrodes of a semiconductor chip formed of a semiconductor of silicon, an underfill resin having the Young's modulus less than 100 kgf/mm$^2$ is filled in the gap of the junction of the semiconductor chip and the package substrate.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
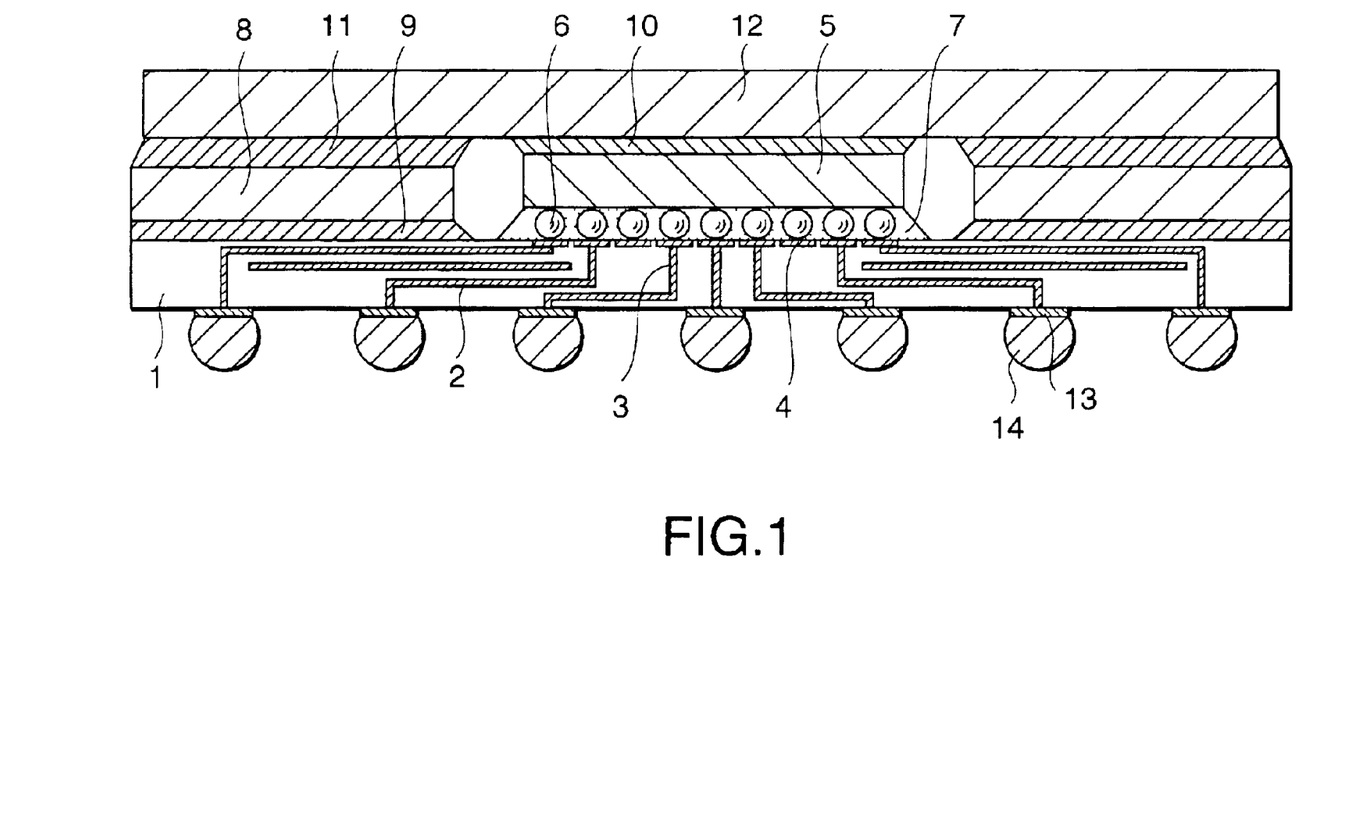
FIG. 1 is a sectional view of the FCBGA package according to a first embodiment of the invention.

Referring to the drawings, the embodiments of this invention will be described. FIG. 1 is a sectional view of the first embodiment of a semiconductor device in which the present invention is realized as an FCBGA package. A package substrate 1 is formed as a thin plate-form multiplayer wiring structure by laminating a plurality of conductive layers with required pattern via insulating layers, where conductive layers 2 of various layers are electrically connected mutually as well as selectively by means of vias 3. Loading pads 4 are formed on the top face of the package substrate 1 using a part of a wiring layer having a required pattern, and a semiconductor chip 5 is loaded with its face down on the loading pads 4. The semiconductor chip 5 has chip size of 17 mm square, and 3000 solder bumps 6 are arranged on its bottom face with a pitch of 240 μm, and are connected by fusion to auxiliary solders, not shown, formed on the surface of the loading pads. The fracture strength of one piece of solder bump is in the range of 110 to 140 g, with the average of 120 g. The size of the gap between the semiconductor chip 5 loaded on the solder bumps 6 and the package substrate 1 is about 140 μm, and an underfill resin 7 is filled in over the regions of the bottom face and the side face of the semiconductor chip 5 so as to close the gaps just mentioned.

Moreover, on the top face of the package substrate 1, frame-like reinforcing plates 8 made of Cu are bonded in the periphery of the semiconductor chip 5 by means of an adhesive resin 9. The top face of the semiconductor chip 5 is coated with Ag paste 10, and the top face of the reinforcing plates 8 is coated with an adhesive resin 11, a lid 12 formed of Cu is placed covering these coatings, and the lid 12 is settled there by curing the adhesive resin 11. Furthermore, a large number of ball pads 13 are disposed on the bottom face of the package substrate 1, and the FCBGA package is formed by placing the package on a circuit pattern of a mother board, not shown, and is mounted on a package land constituted by a part of the circuit pattern by means of the BGA balls 14.

Figure 2:
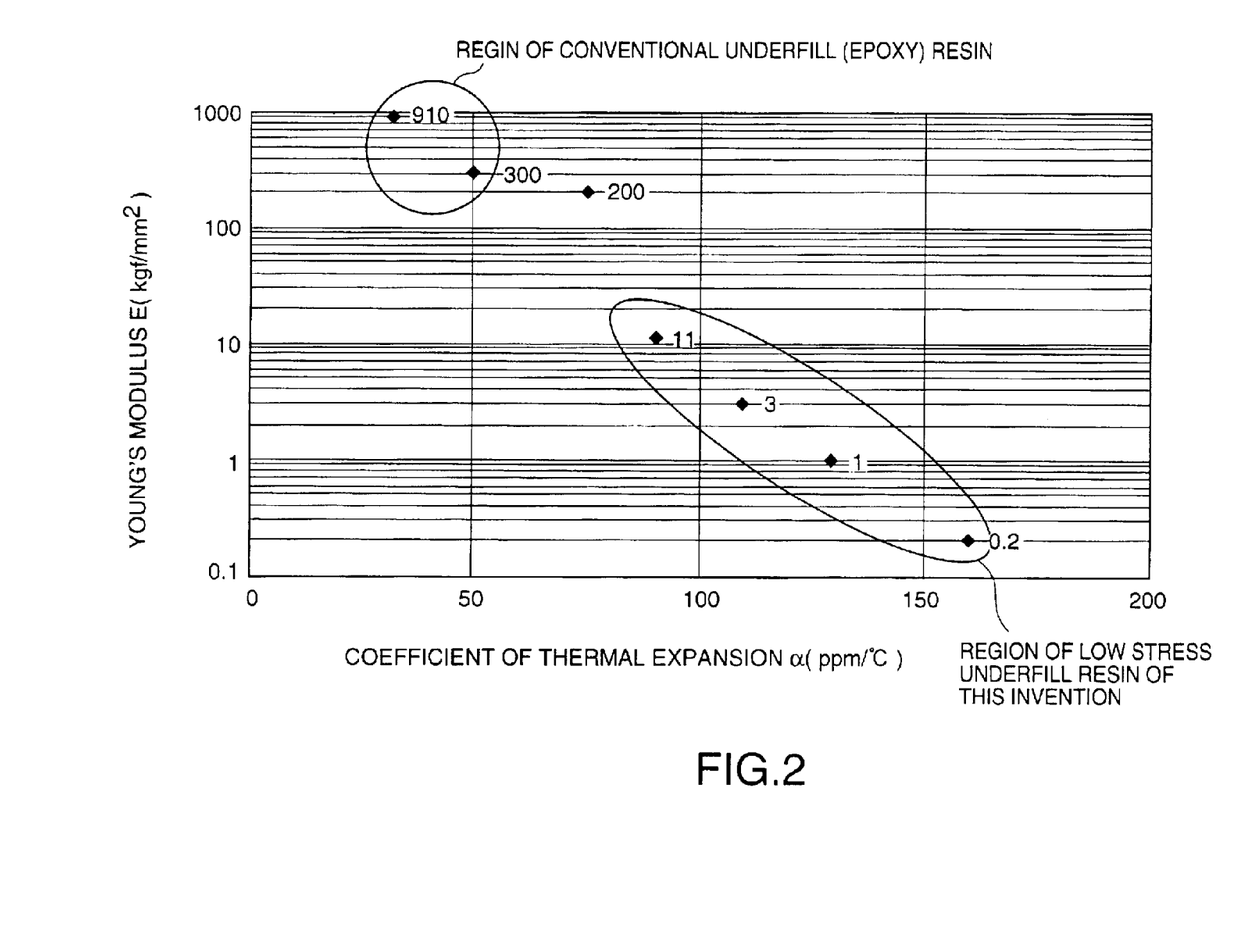
FIG. 2 is a diagram showing the characteristic relationship between the Young's modulus and the coefficient of thermal expansion of the underfill resin.

The underfill resin 7 which is filling the space between the semiconductor chip 5 and the package board 1 and covers the solder bumps 6 is a resin with low Young's modulus and high coefficient of thermal expansion, and in this embodiment, use is made of an epoxy resin modified by polyether. Among epoxy resins of this kind, those with Young's modulus less than 100 kgf/mm$^2$ (referred to as E100 hereinafter), and more particularly a resin with E11 among those with E20 or less indicated in the figure by an elliptic region is adopted in this embodiment. It is to be noted that the coefficient of thermal expansion has a correlation with the Young's modulus, and the coefficient of. thermal expansion of resins with the Young's modulus less than E100 is roughly in the range of 80–160 ppm/° C. (referred to as α80–160 hereinafter).

Figure 3:
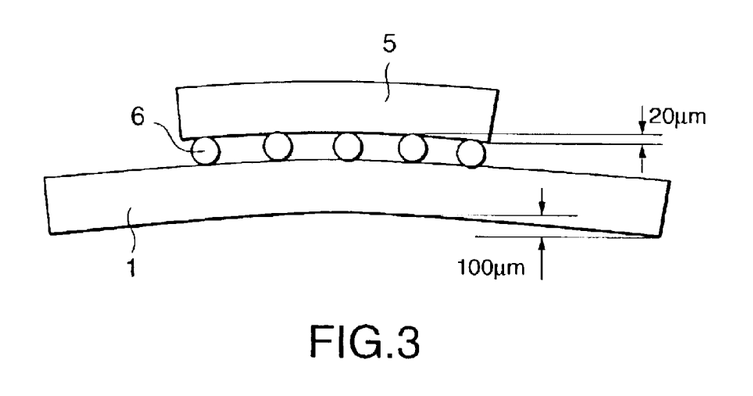
FIG. 3 is a schematic diagram showing the warping in the semiconductor chip and the package substrate.

As in the above, by using a resin with the Young's modulus of less than E100, preferably one with E11 among those having the modulus lower than E20, which is markedly low compared with resins used heretofore, and with the coefficient of thermal expansion of α80–160 which is higher than the conventional value, as an underfill resin 7, it is possible to relax the thermal stress generated between the semiconductor chip 5 and the package substrate 1, and prevent the warp of the semiconductor chip 5 and the package substrate 1 directly below the chip 5, and also the fracture of solder bumps. According to the measurement, the warpage at the central part of the semiconductor chip 5 is about 20 μm in contrast to the values in the periphery of the semiconductor chip 5, and the warpage on the bottom face of the package substrate 1 directly below the semiconductor chip 5 is about 100 μm, as shown in the schematic diagram in FIG. 3. In the semiconductor device of this kind, the warpage of the semiconductor chip is tolerable up to about 40 μm, and the warpage in the package board is tolerable up to about 150 μm, so it can be seen that the values of the FCBGA package of the first embodiment of the invention are within the tolerable range. By satisfying the requirement of these values to be within the tolerable range, such problems as the reduction in the mounting reliability due to deterioration in the coplanarity of the BGA balls 14 in mounting the FCBGA package on a mother board, cracks or chippings in the semiconductor chip 5, and the fracture of solder bumps in a heat cycle test can be prevented, thereby realizing a satisfactory mounting.

Figure 4:
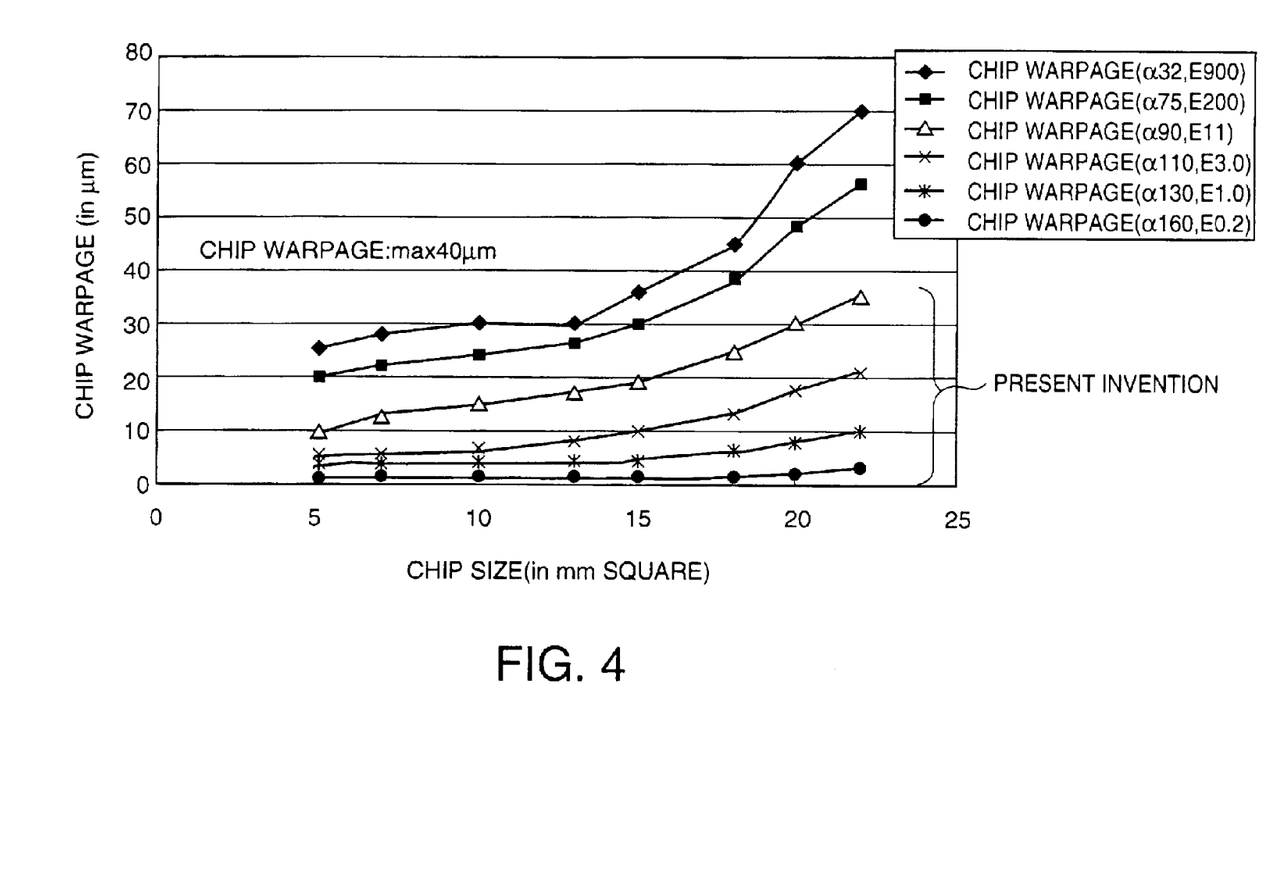
FIG. 4 is a simulation chart showing the correlation between the Young's modulus and the warpage of the semiconductor chip by the chip size.
Figure 5:
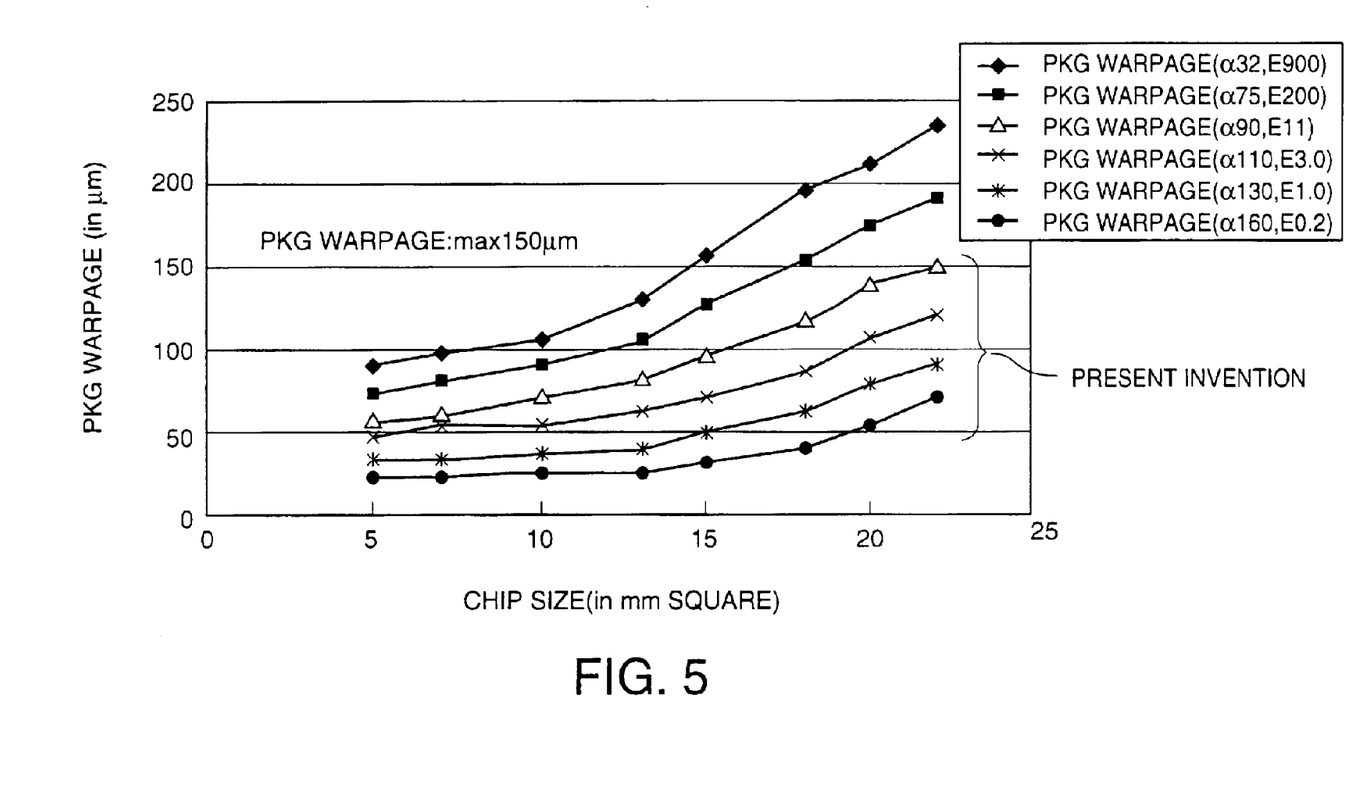
FIG. 5 is a simulation chart showing the correlation between the Young's modulus and the warpage of the package substrate by the chip size.

Here, assuming FCBGA packages obtained by packaging each square semiconductor chip with side length of 5 mm, 7 mm, 10 mm, 13 mm, 15 mm, 18 mm, 20 mm and 22 mm on a package substrate with configuration as shown in FIG. 1, and filling in for each semiconductor chip each underfill resin with Young's modulus (value in the parentheses indicates the coefficient of thermal expansion) of E900 (α32), E200 (α75), E11 (α90), E3.0 (α110), E1.0 (α130) and E0.2 (α160), the present inventor carried out simulation for measuring the warpage in the semiconductor chip and package board (PKG) for each of these FCBGA packages. The result is shown in FIG. 4 and FIG. 5.

As can be seen from these figures, underfill resin meeting the necessary conditions of less than 40 μm for the warpage of the semiconductor chip and less than 150 μm for the warpage of the package boardf, mentioned above for realizing a satisfactory mounting, has a dependence on the size of the semiconductor chip, and that the Young's modulus of less than E200 is required to satisfy the above conditions for the size of 15 mm square or over for the semiconductor chip in recent years. Furthermore, in order to satisfy the condition of less than 20 μm for the warpage of the semiconductor chip and less than 100 μm for the warpage of the package board which are severer than the conditions in the above for the current chip size of a 10 to 15 mm square, and to satisfy the conditions for the chip size of a 18 to 22 mm square to be required in the future, it became clear that it is necessary to set the Young's modulus to less than E20.

In FIG. 2 is shown a comparison of characteristic distributions of the Young's modulus and the coefficient of thermal expansion for the underfill resin required in the present invention and the conventional underfill resin. The conventional underfill resins are distributed in the elliptic region in the upper left of the figure, and the underfill resins of this invention are distributed in the elliptic region in the lower right of the figure.

As in the above, by the use of an underfill resin 7 with the Young's modulus less than E100 and the coefficient of thermal expansion in the range of α80–160, the FCBGA package of this embodiment is able to prevent the warp of the package board by suppressing the warp of the semiconductor chip 5, prevent the fracture of the solder bumps due to the heat cycle test, and realize satisfactory mounting to the mother board. As a result, it is possible to prevent the warp of the FCBGA package by the use of a single kind of low elasticity resin, without requiring the coverage of the solder bumps of the semiconductor chip with a high elasticity resin, as is done in the second prior art technology, which realizes the simplification of the structure of the device and the manufacturing processes, leading to the realization of low cost and high reliability.

Figure 6:
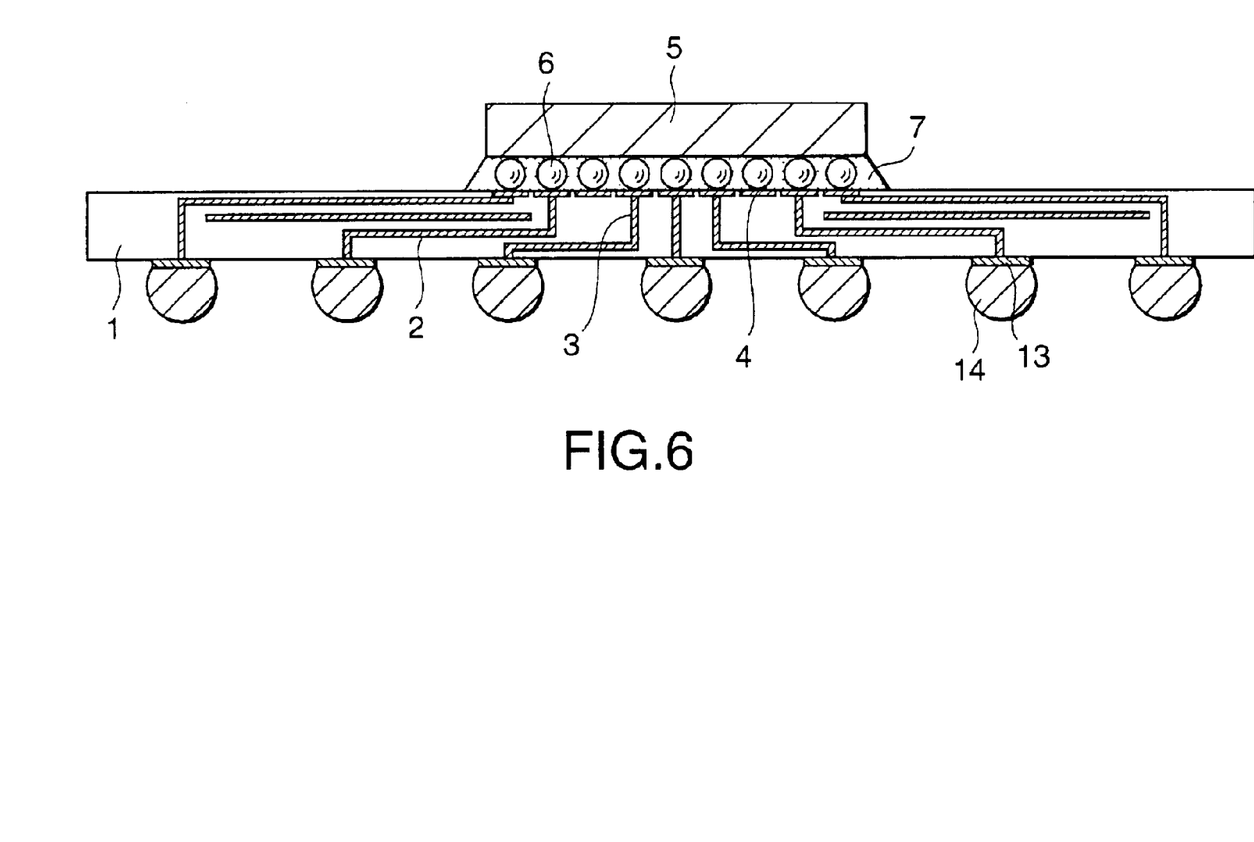
FIG. 6 is a sectional view of the FCBGA package according to a second embodiment of the invention.

It is to be noted that the FCBGA package according to the present invention need not be limited to the structure of the first embodiment. For example, as shown in a sectional view of a second embodiment, it may be given a configuration in which a semiconductor chip 5 may be loaded with its face down using solder bumps 6 on a package substrate 1 formed as a multilayer wiring structure similar to the first embodiment, and an underfill resin 7 with the Young's modulus of less than E100 and the coefficient of thermal expansion in the range of α80 to 160 is just filled without further arrangement in the gap between the semiconductor chip 5 and the package substrate 1 so as to cover the solder bumps 6. That is, it maybe formed into a semiconductor device of bare chip structure in which the semiconductor chip 5 is exposed to the air. Since the reinforcing plates and the lid formed of Cu, as in the first embodiment, are absent in the FCBGA package of the second embodiment, the structure can be simplified and further thinning of the device can be realized. On the other hand, however, the package substrate tends to generate warping. Nonetheless, the warp in the semiconductor chip 5 and the package substrate 1 can be prevented and satisfactory mounting on the mother board can be realized as in the first embodiment by using an underfill resin 7 having the Young's modulus less than E100.

Figure 7:
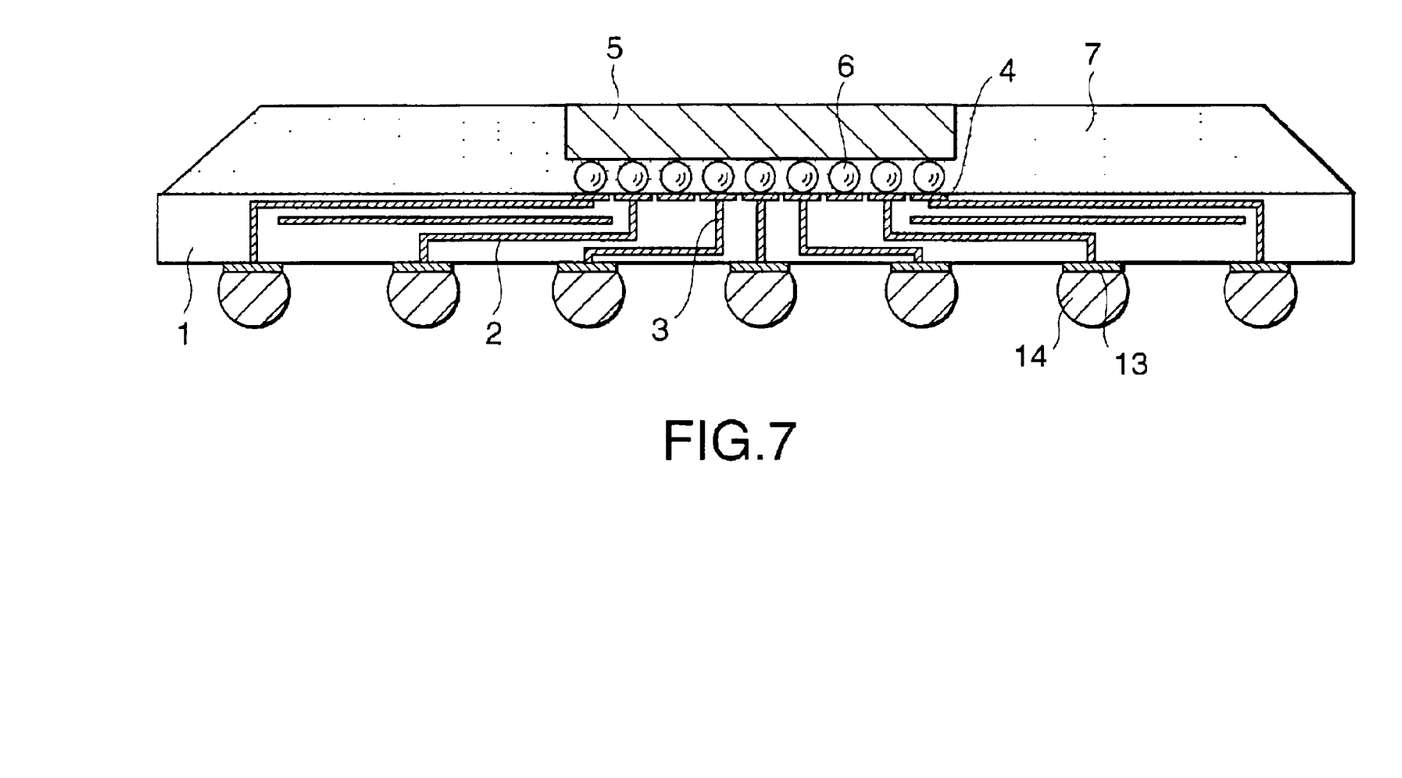
FIG. 7 is a sectional view of the FCBGA package according to a third embodiment of the invention.

FIG. 7 is a sectional view of the FCBGA package of a third embodiment. In this embodiment, similar to the first and second embodiments, after loading the semiconductor chip 5 on the package substrate 1 by means of solder bumps 6, an underfill resin 7 with the Young's modulus less than E100 and the coefficient of thermal expansion in the range of α80 to 160 is filled in the gap between the semiconductor chip 5 and the package substrate 1 and is coated over the almost entire top face of the package substrate 1 as well, to a thickness to have a height almost the same as the top face of the semiconductor chip 5. In this structure, simplification and thinning of the FCBGA package similar to the second embodiment can be realized, and the warp of the semiconductor chip and package board can be suppressed and satisfactory mounting of the semiconductor chip to the mother board can be realized similar to the first embodiment by employing an underfill resin 7 with the Young's modulus less than E100. Moreover, in this embodiment, since the underfill resin 7 exists in the form of a thick film on the almost entire face of the package substrate 1, stress generated in the regions other than the region where the semiconductor chip 5 is loaded on the top face of the package board can respectively be absorbed and relaxed, and the warp not only in the semiconductor chip 5 and in the package substrate 1 directly below the chip but also on the entire package substrate 1 can be prevented.

Figure 8A:
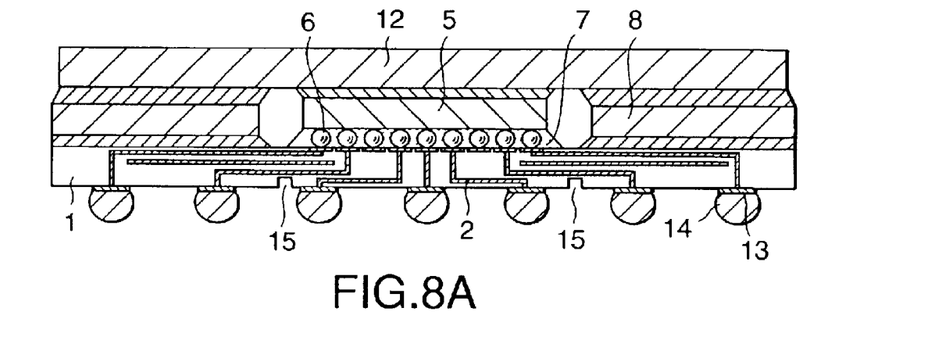
FIGS. 8A and 8B are a sectional view and rear view of the FCBGA package according to a fourth embodiment of the invention.
Figure 8B:
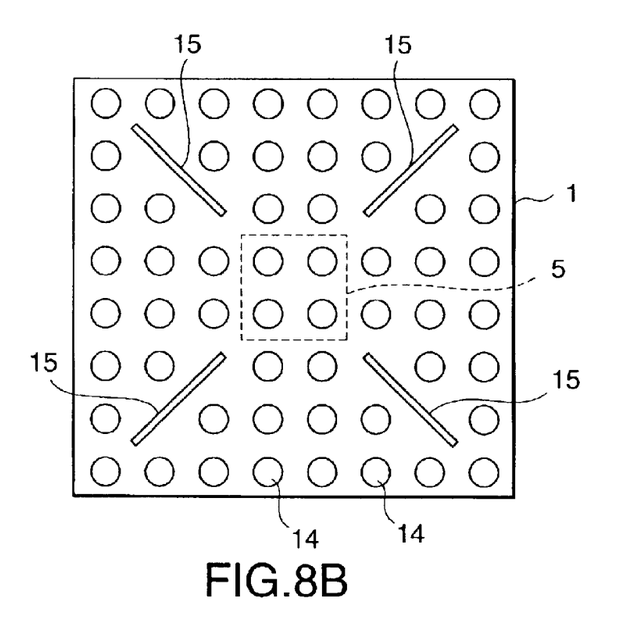

FIGS. 8A and 8B are a sectional view and a rear view of the FCBGA package according to a fourth embodiment of the invention. This embodiment is a modification of the first embodiment, and the components identical to those of the first embodiment are given identical symbols. In this embodiment, trenches 15 with required width and required depth are formed on the bottom face of the package substrate 1 radially from positions corresponding to the periphery of the semiconductor chip 5 in the directions toward the four corners of the substrate 1 along the regions not interfering with the BGA balls 14. By forming an FCBGA package equipped with these trenches 15, warp in the semiconductor chip 5 and the package substrate 1 can be suppressed by using an underfill resin 7 similar to that used in each of the embodiments, and the stress applied to the package substrate 1 caused by micro deformations in the package substrate 1 at the trenches 15 can be absorbed, so the warp in the package substrate 1 and the warp in the semiconductor chip 5 can be suppressed more effectively. As long as the trenches 15 are such that they do not interfere with the BGA balls while holding strength required by the package substrate 1, their shape is not limited to that of this embodiment, and they may be formed in an arbitrary number at an arbitrary positions, with an arbitrary sectional form with arbitrary width, depth and length. Moreover, by forming similarly the trenches 15 of this embodiment in each of the FCBGA packages of the second and third embodiments the warp in the semiconductor chip 5 and the package substrate 1 can be prevented more effectively.

Figure 9:
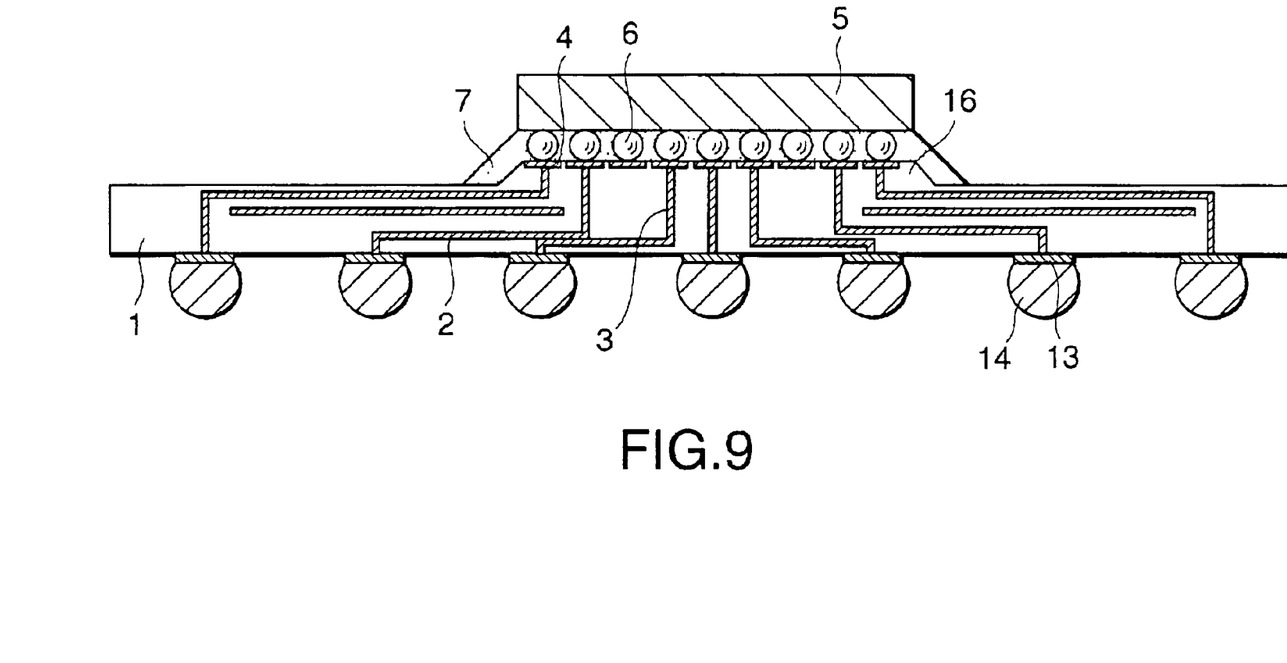
FIG. 9 is a sectional view of the FCBGA package according to a fifth embodiment of the invention.

FIG. 9 is a sectional view of the FCBGA package according to a fifth embodiment of the invention. This embodiment is a modification of the second embodiment, and the components identical to those in FIG. 6 are given identical symbols. In this embodiment, the thickness of the package substrate 1 in the region where the semiconductor chip 5 is loaded is made larger than in the periphery, and this region is formed as protrusions 16. Accordingly, loading pads 4 formed of a part of the wiring layer for loading the semiconductor chip 5 are formed on the surface of the protrusions 16. In the FCBGA package equipped with the protrusions 16, it is possible to suppress the warp of the semiconductor chip 5 and the package substrate 1 by the underfill resin 7 similar to each of the other embodiments, and moreover, to suppress more effectively the warp in the package board and the warp in the semiconductor chip 5, by enhancing the rigidity of the package substrate 1 directly below the semiconductor chip 5 by means of the protrusions 16 formed on the package substrate 1. By similarly forming the protrusions 16 as in this embodiment in the FCBGA packages of the first, third and fourth embodiments, it is possible to prevent more effectively the warp as well as the fracture of the solder bumps due to heat cycle test.

Here, if a semiconductor device of interest has such a constitution that a semiconductor chip is loaded with its face down on a package board by means of solder bumps or the like, and the package substrate is mounted on a mother board by BGA balls provided on the bottom face of the package substrate, by using as an underfill resin for filling the gap between the semiconductor chip and the package substrate, the underfill resins according to this invention, it is possible to realize a semiconductor device that can effectively prevent the warp in the semiconductor chip and the package substrate and the fracture in the solder bumps.

As described in the above, according to the present invention by which the gap between the semiconductor chip and the package substrate is filled with an underfill resin with the young's modulus less than E100, and preferably with the coefficient of thermal expansion in the range of α80 to 160, the warp in the semiconductor chip and in the package substrate and the fracture of the solder bumps due to heat cycle test can be prevented, and can realize satisfactory mounting on the mother board. Furthermore, according to the invention, by providing trenches or protrusions in the package substrate, it is possible to further enhance the preventive effect, due to the underfill resin, of the warp in the semiconductor chip and the package substrate. In this way, the warp in the FCBGA package can be prevented by means only of a single low elasticity resin, which leads to realization of simplification in the structure and manufacturing processes of the semiconductor device, and to realization of low cost and high reliability of the semiconductor device.

Although the invention has been described with reference to specific embodiments, this invention is not meant to be construed in a limiting sense. Various modifications of the disclosed embodiments will become apparent to persons skilled in the art upon reference to the description of the invention. It is therefore contemplated that the appended claims will cover any modifications of embodiments as fall within the true scope of the invention.

What is claimed is:

1. A semiconductor device, comprising:

electrodes of a package substrate composed of a resin; and electrodes of a semiconductor chip formed of a silicon semiconductor connected to said electrodes of the package substrate, wherein a gap in the junction between said semiconductor chip and said package substrate is filled with an underfill resin having the Young's modulus less than 100 kgf/mm$^2$, and wherein the coefficient of thermal expansion of said underfill resin is 80 to 160 ppm/° C.

2. The semiconductor device as claimed in claim 1, wherein said underfill resin is an epoxy resin modified by polyether.

3. The semiconductor device as claimed in claim 1, wherein the Young's modulus of said underfill resin is less than 20 kgm/mm$^2$ when the chip size of said semiconductor chip is equal to or more than the area of a square with a side of 15 mm.

4. The semiconductor device as claimed in claim 1, wherein balls of a ball grid array (BGA) are arranged on the bottom face of said package substrate in a region including the region directly below said semiconductor chip.

5. The semiconductor device as claimed in claim 1, wherein the structure of the semiconductor device is such that said semiconductor chip has solder bumps and said solder bumps are connected to loading pads formed on the top face of said package substrate.

6. The semiconductor device as claimed in claim 1, wherein there are arranged frame-like reinforcing plates on the top face of said semiconductor chip in the periphery of said semiconductor chip and a plate-like lid is fixed to the top face of said reinforcing plates so as to cover also said semiconductor chip.

7. The semiconductor device as claimed in claim 1, wherein said underfill resin is provided over almost the entire region of the top face of said package substrate.

8. The semiconductor device as claimed in claim 1, wherein on the bottom face of said package substrate there are formed trenches that extend from positions in the vicinity of said semiconductor chip toward the peripheral region of said package substrate.

9. The semiconductor device as claimed in claim 1, wherein trenches are formed from positions in the vicinity of four corners of said semiconductor chip radically in directions toward the four corners of said package substrate.

10. The semiconductor device as claimed in claim 1, wherein protrusions are formed on the top face of said package substrate in a region directly below said semiconductor chip thereby increasing the thickness of the board in the region.

* * * * *